(12) United States Patent
Dong et al.

(10) Patent No.: US 11,349,088 B2
(45) Date of Patent: May 31, 2022

(54) FLEXIBLE DISPLAY PANEL HAVING DISTRIBUTED HOLES

(71) Applicant: BOE TECHNOLOGY GROUP CO., LTD., Beijing (CN)

(72) Inventors: Liming Dong, Beijing (CN); Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 20 days.

(21) Appl. No.: 16/642,014

(22) PCT Filed: Aug. 23, 2019

(86) PCT No.: PCT/CN2019/102270
§ 371 (c)(1),
(2) Date: Feb. 25, 2020

(87) PCT Pub. No.: WO2020/073745
PCT Pub. Date: Apr. 16, 2020

(65) Prior Publication Data
US 2020/0243780 A1    Jul. 30, 2020

(30) Foreign Application Priority Data
Oct. 12, 2018    (CN) .......................... 201811188515.3

(51) Int. Cl.
*H01L 51/00* (2006.01)
*H01L 51/52* (2006.01)
(Continued)

(52) U.S. Cl.
CPC ...... *H01L 51/0097* (2013.01); *H01L 51/5253* (2013.01); *H01L 51/56* (2013.01);
(Continued)

(58) Field of Classification Search
CPC ............. H01L 51/0097; H01L 51/5253; H01L 51/5293; H01L 2251/5338;
(Continued)

(56) References Cited

U.S. PATENT DOCUMENTS 8,470,687 B2 *   6/2013   Forbes .............. H01L 21/76254
                                                          438/450
9,189,027 B2    11/2015   Lee et al.
(Continued)

FOREIGN PATENT DOCUMENTS

CN    104346999 A    2/2015
CN    104424851 A    3/2015
(Continued)

OTHER PUBLICATIONS

International Search Report and Written Opinion dated Nov. 28, 2020, for corresponding PCT Application No. PCT/CN2019102270.
(Continued)

*Primary Examiner* — Ida M Soward
(74) *Attorney, Agent, or Firm* — Kinney & Lange, P.A.

(57) ABSTRACT

A flexible substrate includes a first part and a second part at a side surface of the first part which is perpendicular to a plane in which the first part extends. An elastic modulus of the first part is less than an elastic modulus of the second part, and holes are distributed in the flexible substrate.

19 Claims, 7 Drawing Sheets

(51) Int. Cl.
*H01L 27/14* (2006.01)
*H01L 27/32* (2006.01)
*H01L 33/44* (2010.01)
*G02F 1/133* (2006.01)
*H01L 51/56* (2006.01)
*H01L 27/146* (2006.01)
*G02F 1/1335* (2006.01)

(52) U.S. Cl.
CPC .. *G02F 1/133528* (2013.01); *H01L 27/14678* (2013.01); *H01L 27/323* (2013.01); *H01L 33/44* (2013.01); *H01L 51/5293* (2013.01); *H01L 2251/5338* (2013.01)

(58) Field of Classification Search
CPC . H01L 27/14678; H01L 27/323; H01L 33/44; G02F 1/133528
See application file for complete search history.

(56) References Cited

U.S. PATENT DOCUMENTS

| | | | |
|---|---|---|---|
| 9,210,752 B2 * | 12/2015 | Kobayashi | G09G 3/34 |
| 9,280,182 B2 * | 3/2016 | Ha | G06F 1/1626 |
| 9,429,999 B2 | 8/2016 | Lee et al. | |
| 9,639,121 B2 | 5/2017 | Min et al. | |
| 9,768,198 B2 * | 9/2017 | Kawata | H01L 27/1266 |
| 9,799,716 B2 * | 10/2017 | Hatano | H01L 51/56 |
| 9,818,961 B2 * | 11/2017 | Hiroki | H01L 51/0097 |
| 10,217,950 B2 | 2/2019 | Joo et al. | |
| 10,492,311 B2 | 11/2019 | Liu et al. | |
| 10,559,633 B2 * | 2/2020 | Chen | H01L 27/3244 |
| 10,582,032 B2 * | 3/2020 | Pizzo | H04M 1/026 |
| 10,714,048 B2 | 7/2020 | Wang et al. | |
| 2010/0051327 A1 * | 3/2010 | Ogatsu | H05K 3/4635 174/254 |
| 2014/0092356 A1 * | 4/2014 | Ahn | G02F 1/1339 349/153 |
| 2015/0029652 A1 | 1/2015 | Min et al. | |
| 2015/0049428 A1 | 2/2015 | Lee et al. | |
| 2016/0048171 A1 | 2/2016 | Lee et al. | |
| 2016/0104850 A1 | 4/2016 | Joo et al. | |
| 2016/0212822 A1 | 7/2016 | Kim | |
| 2018/0035554 A1 | 2/2018 | Liu et al. | |
| 2019/0148655 A1 | 5/2019 | Joo et al. | |
| 2019/0295494 A1 | 9/2019 | Wang et al. | |
| 2020/0243780 A1 | 7/2020 | Dong et al. | |

FOREIGN PATENT DOCUMENTS

| | | | |
|---|---|---|---|
| CN | 105514115 | A | 4/2016 |
| CN | 105609006 | A | 5/2016 |
| CN | 106328003 | A | 1/2017 |
| CN | 106652802 | A | 5/2017 |
| CN | 10795252 | A | 9/2017 |
| CN | 108399863 | A | 8/2018 |
| CN | 109345959 | A | 2/2019 |
| JP | 2004096015 | A * | 3/2004 |
| KR | 20140001579 | A | 1/2014 |

OTHER PUBLICATIONS

First Chinese Office Action dated Nov. 4, 2019, for corresponding Chinese Application No. 201811188515.3.

* cited by examiner

FLEXIBLE DISPLAY PANEL HAVING DISTRIBUTED HOLES

CROSS-REFERENCE TO RELATED APPLICATION

This application is a Section 371 National Stage Application of International Application No. PCT/CN2019/102270, filed on Aug. 23, 2019 and entitled with "FLEXIBLE SUBSTRATE, FLEXIBLE DISPLAY PANEL, FLEXIBLE DISPLAY DEVICE AND METHODS FOR MANUFACTURING THE SAME", and claims priority to Chinese Application No. 201811188515.3, filed on Oct. 12, 2018, the contents of which are incorporated herein by reference in their entirety.

TECHNICAL FIELD

Embodiments of the present disclosure relate to the field of display technology, and in particular, to a flexible substrate, a flexible display panel, a flexible display device, and methods for manufacturing the same.

BACKGROUND

With the advancement of science and technology and the development of society, flexible display panels have been gradually used by consumers. Bendable and stretchable display panels have brought the consumers a new user experience while facilitating the consumers' lives.

However, for the currently developed stretchable display panels, when they are stretched or in a stretched state, the amount of deformation across the substrate or other film layers may vary due to uneven stress applied on the substrate or the other film layers. For example, in a condition that there are holes existing in the substrate or the other film layers, the amounts of deformation of the holes may vary hole by hole, and among others, there may exist more significant difference between the amounts of deformation of the portion of the holes falling within the region where a pull force is directly applied and the amounts of deformation of another portion of the holes away from the region where a pull force is directly applied, during the stretch, resulting in a relatively poor uniformity of the display effect across the display panels.

SUMMARY

According to a first aspect of the present disclosure, there is provided a flexible substrate comprising:

a first part; and a second part at a side surface of the first part which is perpendicular to a plane in which the first part extends, wherein an elastic modulus of the first part is less than an elastic modulus of the second part, wherein holes are distributed in the flexible substrate.

According to some embodiments of the present disclosure, the second part comprises an elastic material, and the second part is attached to the first part.

According to some embodiments of the present disclosure, the second part is formed by doping an elastic material into a side end of a material layer, the side end is an end of the material layer close to a side surface of the material layer, which is perpendicular to a plane in which the material layer extends, and a portion of the material layer which is not doped forms the first part, wherein an elastic modulus of the elastic material is greater than the elastic modulus of the first part.

According to some embodiments of the present disclosure, the elastic material comprises a rubber material or a stainless steel material.

According to some embodiments of the present disclosure, holes are distributed in the flexible substrate.

According to some embodiments of the present disclosure, the second part comprises a plurality of sub-parts located at different side surfaces of the first part respectively.

According to some embodiments of the present disclosure, the number of the sub-parts is two, and the two sub-parts are respectively located at opposite side surfaces of the first part.

According to some embodiments of the present disclosure, the number of the sub-parts is four, and the four sub-parts surround a periphery of the first part.

According to some embodiments of the present disclosure, the second part comprises a plurality of sections of film material, and the plurality of sections of film material are sequentially attached to one another and in turn to a side surface of the first part, elastic moduli of the sections of film material are different from the modulus of the first part, and the elastic moduli of the sections of film material are different from one another.

According to some embodiments of the present disclosure, a doping concentration of the elastic material doped in the second part gradually decreases in a direction from the second part to the first part.

According to a second aspect of the present disclosure, there is provided a flexible display panel, comprising a flexible substrate, a display functional layer and at least one protective film layer, wherein the flexible substrate and/or the at least one protective film layer comprises a first region corresponding to a display region of the display functional layer and a second region corresponding to a non-display region of the display functional layer, wherein an elastic modulus or elastic moduli of the first regions of the flexible substrate and/or the at least one protective film layer is/are less than an elastic modulus or elastic moduli of the second regions of the flexible substrate and/or the at least one protective film layer, wherein holes are distributed in the flexible substrate.

According to some embodiments of the present disclosure, the second region comprises an elastic material, and the second region is attached to the first region.

According to some embodiments of the present disclosure, the second region is formed by doping an elastic material into a side end of a material layer, the side end is an end of the material layer close to a side surface of the material layer, which is perpendicular to a plane in which the material layer extends, and a portion of the material layer which is not doped forms the first region, wherein an elastic modulus of the elastic material is greater than the elastic modulus of the first region.

According to some embodiments of the present disclosure, the at least one protective film layer comprises a back film located on a side of the flexible substrate away from the display functional layer and a cover plate located on a side of the display functional layer away from the flexible substrate.

According to some embodiments of the present disclosure, the elastic material comprises a rubber material or a stainless steel material.

According to some embodiments of the present disclosure, the flexible substrate, the back film and the cover plate each comprise a first region and a second region, and the second regions of the flexible substrate, the back film and the cover plate are made of different elastic materials.

According to a third aspect of the present disclosure, there is provided a flexible display device, comprising the flexible display panel according to the second aspect.

According to a fourth aspect of the present disclosure, there is provided a method for manufacturing a flexible substrate, comprising:

attaching an elastic material to a side surface of a flexible substrate base, or doping an elastic material into a side end of the flexible substrate base, the side surface being perpendicular to a plane in which the flexible substrate base extends, wherein an elastic modulus of the flexible substrate base is less than an elastic modulus of the elastic material.

According to a fifth aspect of the present disclosure, there is provided a method for manufacturing a flexible display panel, comprising:

forming a flexible substrate;

forming a display functional layer on the flexible substrate; and forming at least one protective film layer, wherein the flexible substrate and/or the at least one protective film layer comprises a first region corresponding to a display region of the display functional layer and a second region corresponding to a non-display region of the display functional layer, wherein an elastic modulus or elastic moduli of the first regions of the flexible substrate and/or the at least one protective film layer are less than an elastic modulus or elastic moduli of the second regions of the flexible substrate and/or the at least one protective film layer, wherein holes are distributed in the flexible substrate.

According to some embodiments of the present disclosure, the method further comprises:

attaching an elastic material to a side surface of the first region to form the second region; or forming a material layer and doping an elastic material into a side end of the material layer to form the second region, the side end being an end of the material layer close to a side surface of the material layer, which is perpendicular to a plane of in which the material layer extends, a portion of the material layer which is not doped forming the first region.

BRIEF DESCRIPTION OF THE DRAWINGS

The specific embodiments of the present disclosure will be further described in detail below with reference to the accompanying drawings.

DETAILED DESCRIPTION OF EMBODIMENTS

Figure 1:
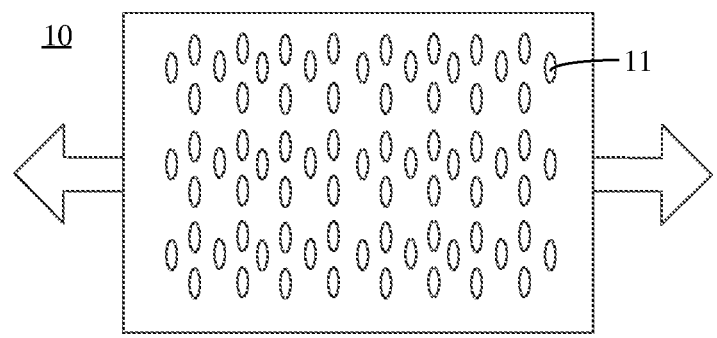
FIG. 1 is a schematic view showing holes in a flexible substrate when no force is applied to a flexible display panel in the related art.

In order to describe the present disclosure more clearly, the present disclosure is further described below with reference to the embodiments and the accompanying drawings. Similar parts in the drawings are indicated by the same reference numerals. It should be appreciated by those skilled in the art that the specific description below is illustrative but not restrictive, therefore the description should not limit the scope of the present disclosure.

Figure 2:
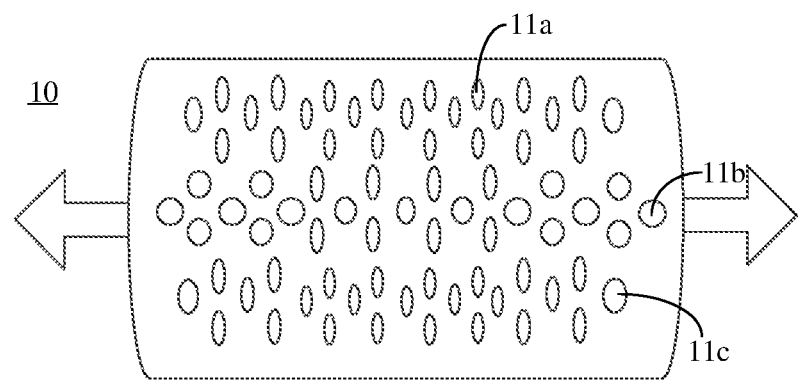
FIG. 2 is a schematic view showing holes in a flexible substrate when a force is applied to a flexible display panel in the related art.

Currently, in order to overcome the problem of uneven force caused by stretching or bending, and improve the stretching performance of a flexible display panel, the flexible display panel is generally provided with first holes 11 in a substrate 10 and a protective film layer thereof, as shown in FIG. 1. When no force is applied to the flexible display panel, the first holes 11 in the substrate 10 or the protective film layer are properly distributed, and the first holes 11 are substantially identical, i.e., have little differences, in a normal state, and the image displayed by the flexible display panel is clear and uniform. However, when a pull force is applied to the flexible display panel to bring about a stretching effect thereon, the holes in the substrate 10 and the protective film layer deform differently because the pull force is concentrated on a certain area, as shown in FIG. 2. The deformation amounts of second holes 11b in the line of the pull force and third holes 11c at the margins are relatively large, but the deformation amounts of fourth holes 11a in a region far away from the line of the pull force are relatively smaller. At this time, the image displayed by the flexible display panel is distorted and has poor uniformity.

Figure 3:
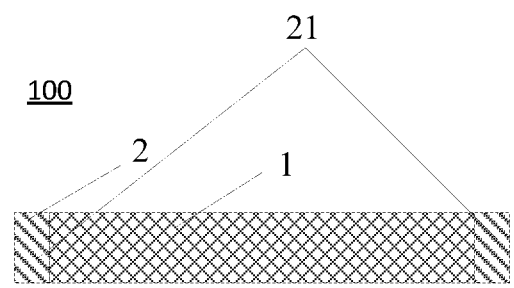
FIG. 3 is a front view of a flexible substrate according to an embodiment of the present disclosure.

In order to solve the above problems, as shown in FIG. 3, a flexible substrate 100 is provided in an embodiment of the present disclosure, comprising a first part 1 and a second part at a side surface of the first part. An elastic modulus of the first part 1 is less than an elastic modulus of the second part 2. It should be noted that the first part 1 and the second part 2 serve as parts of the flexible substrate 100, and they may be both flexible.

Figure 4:
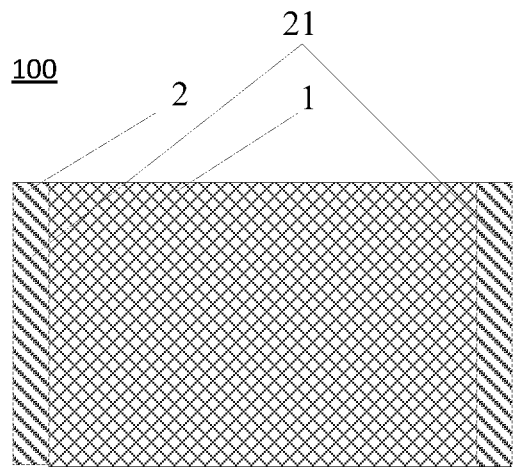
FIG. 4 is a top view of a flexible substrate according to an embodiment of the present disclosure.

In a specific example, the flexible substrate provided with holes is taken as an example to describe the present disclosure, as shown in FIG. 3 and FIG. 4. In order to reduce the differences in the deformations of the holes caused by uneven force during the stretch of the flexible substrate, the second part 2 is provided at a side surface of the first part 1, and the side surface is perpendicular to a plane in which the first part 1 extends and is not limited to a single side or both sides or any peripheral positions of the first part 1, as long as it is designed as per a design criteria that it can withstand the pull force and can disperse the pull force. The elastic modulus of the second part 2 is greater than the elastic modulus of the first part 1, that is, the second part 2 can better withstand the pull force. Therefore, when the flexible substrate 100 is stretched, the second part 2 having a larger elastic modulus provided at the side surface can allow the pull force to be uniformly applied to the holes, and better disperse the concentrated force, thereby reducing differences in the amounts of deformation of the holes.

The second part 2 may include a plurality of sub-parts 21 located at different side surfaces of the first part, respectively. For example, as shown in FIG. 3 and FIG. 4, the number of the sub-parts 21 is two, and the two sub-parts are respectively located at opposite sides of the first part 1; alternatively, the number of the sub-parts 21 may be four, and the four sub-parts surround the periphery of the first part 1.

Figure 5:
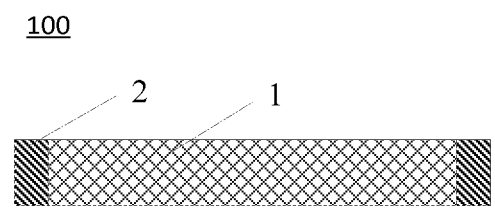
FIG. 5 is a front view of a flexible substrate according to another embodiment of the present disclosure.
Figure 6:
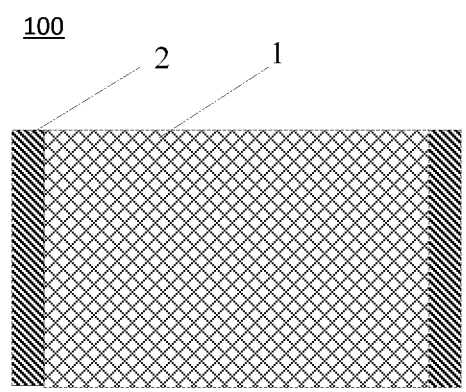
FIG. 6 is a top view of a flexible substrate according to another embodiment of the present disclosure.

In a specific embodiment, as shown in FIG. 5 and FIG. 6, the second part 2 includes an elastic material, and the second part 2 and the first part 1 are disposed in close contact with each other. The second part 2 is made of an elastic material having a larger elastic modulus, including but not limited to a rubber material or a stainless steel (SUS) material, attached to the first part 1, and the larger the contact area of the second part 2 with the first part 1 is, the more favorable it is to disperse the external force as being applied, thereby reducing the differences in the deformations of the holes in the flexible substrate.

Figure 7:
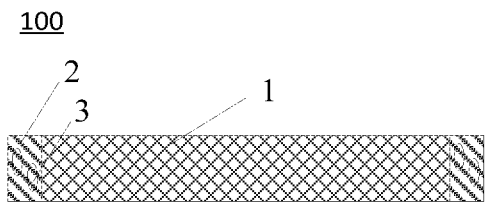
FIG. 7 is a front view of a flexible substrate according to still another embodiment of the present disclosure.
Figure 8:
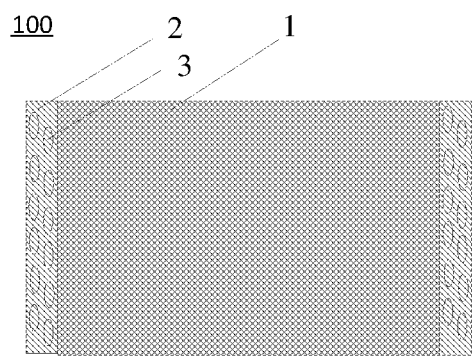
FIG. 8 is a top view of a flexible substrate according to still another embodiment of the present disclosure.

In another specific embodiment, as shown in FIG. 7 and FIG. 8, the second part 2 is formed by doping an elastic material into a side end of a material layer, and a portion of the material layer that is not doped forms the first part 1, wherein an elastic modulus of the elastic material is greater than the elastic modulus of the first part 1. Herein, the side end of the material layer refers to an end of the material layer that is close to a side surface of the material layer that is perpendicular to a plane in which the material layer extends. The second part 2 is doped with an elastic material having a relatively large elastic modulus, for example, a material layer is formed above all, and then a side end of the material layer is doped with particles 3 of a rubber material, a SUS material or the like, having a relatively large elastic modulus, to form the second part 2, so that the overall elastic modulus of the second part 2 is increased to effectively reduce the differences in deformations of the holes caused by an external force. The remaining portion of the material layer that is not doped with the elastic material forms the first part 1.

Corresponding to the flexible substrate according to the foregoing embodiment, a method for manufacturing a flexible substrate is provided in an embodiment of the present disclosure. Since the method for manufacturing a flexible substrate according to this embodiment corresponds to the flexible substrate according to the foregoing embodiment, the aspects in the foregoing embodiment is also applicable to the method for manufacturing a flexible substrate according to this embodiment, and therefore they will not be described in detail in this embodiment.

Figure 9:
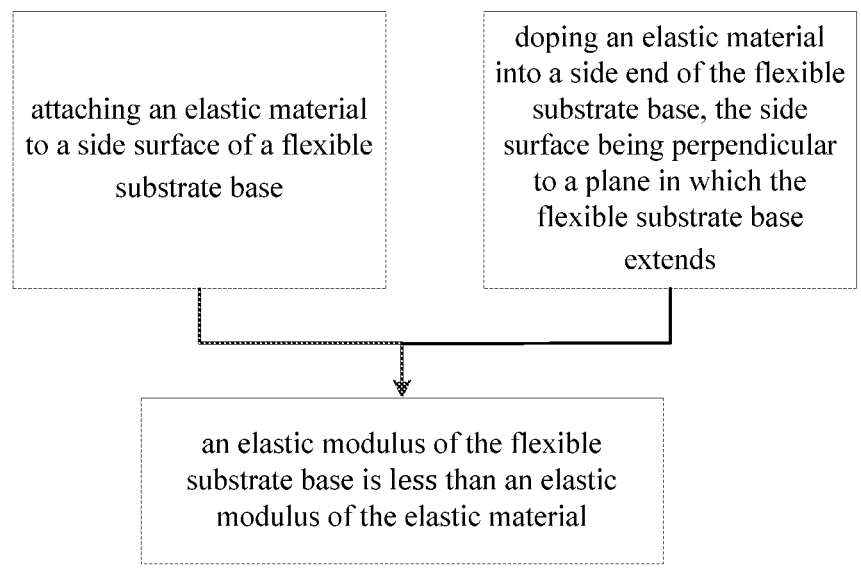
FIG. 9 is a flowchart of a method for manufacturing a flexible substrate according to an embodiment of the present disclosure.

As shown in FIG. 9, the method for manufacturing a flexible substrate includes: attaching an elastic material onto a side surface of a flexible substrate base, or doping an elastic material into a side end of the flexible substrate base, the side surface being perpendicular to a plane in which the flexible substrate base extends, wherein an elastic modulus of the flexible substrate base is less than an elastic modulus of the elastic material. The flexible substrate can be formed by either attaching an elastic material with a relatively large elastic modulus onto the side surface, or doping an elastic material with a relatively large elastic modulus into the side end, thereby increasing the bearing and dispersing capability of the flexible substrate for the pull force.

Figure 10:
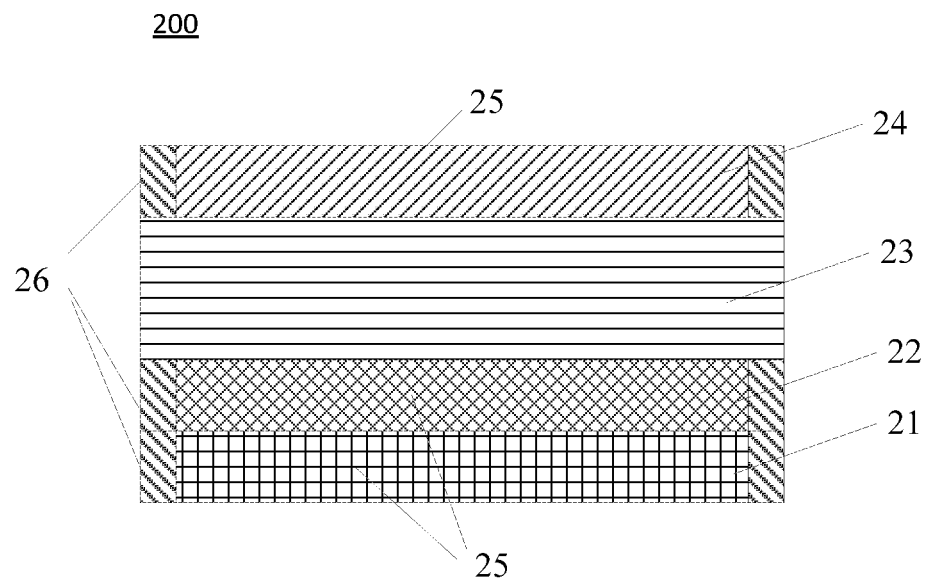
FIG. 10 is a front view of a flexible display panel according to an embodiment of the present disclosure.
Figure 11:
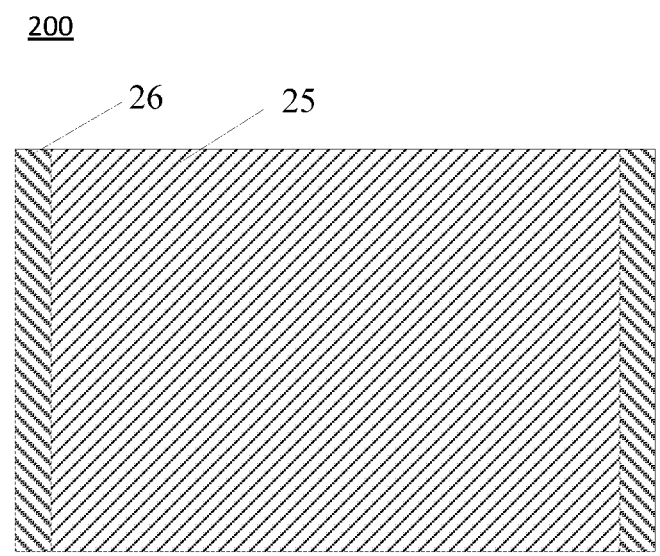
FIG. 11 is a top view of a flexible display panel according to an embodiment of the present disclosure.

Corresponding to the flexible substrate according to the above embodiments, as shown in FIGS. 10 and 11, a flexible display panel 200 is further provided in an embodiment of the present disclosure, including a flexible substrate 22, a display functional layer 23, and a protective film layer. The flexible substrate 22 and/or the protective film layer each include a first region 25 corresponding to a display region of the display functional layer and a second region 26 corresponding to a non-display region of the display functional layer. The elastic modulus or moduli of the first regions 25 of the flexible substrate 22 and/or the protective film layer may be less than the elastic modulus or moduli of the second regions 26 of the flexible substrate 22 and/or the protective film layer, and the first region(s) and the second region(s) may be flexible. The number of the protective film layers may be two, that is, a first protective film layer which may be a back film 21 and a second protective film layer which may be a cover plate 24.

In a specific example, the flexible display panel 200 shown in FIG. 10 includes a flexible substrate 22, a display functional layer 23 including sub-pixels, a circular polarizer, optically clear adhesive and a touch screen panel, a back film 21 located at a side of the flexible substrate 22 distal to the display functional layer 23 side, and a cover plate 24 located at a side of the display functional layer distal to the flexible substrate. The back film 21 is a film layer provided at an outer side of the flexible substrate 22 for supporting and protecting the flexible display panel; the cover plate 24 is a film layer provided at an outer side of the display functional layer 23 and equivalent to an outer shell of the flexible display panel and is used for protecting the flexible display panel 200.

In order to solve the problem of the differences in deformations caused by the uneven force during the stretch of the flexible display panel, a first region 25 and a second region may be provided on the flexible substrate 22 or the protective film layers including the back film 21 and the cover plate 24; alternatively, a first region 25 and a second region 26 may be provided on both the flexible substrate 22 and the protective film layers at the same time. It may be designed by those skilled in the art according to the actual application situation. The first region 25 corresponds to the display region of the flexible display panel 200, the second region 26 corresponds to the non-display region of the flexible display panel 200, and the elastic modulus of the second region 26 is greater than the elastic modulus of the first region 25. Therefore, when the flexible display panel 200 is subjected to a concentrated force in a transversal or longitudinal direction, a second region having a larger elastic modulus is provided on the flexible substrate 22 and/or the protective film layers including the back film 21 and the cover plate 24, facilitating effectively dispersing the concentrated force, so that the external force can be uniformly applied to the flexible substrate, thereby reducing the difference in deformation, and significantly improving the display effect of the flexible display panel 200. As an alternative, only one of the two protective film layers is provided with the first region 25 and the second region 26, and there is no second region 26 provided on the other of the two protective film layers.

Figure 12:
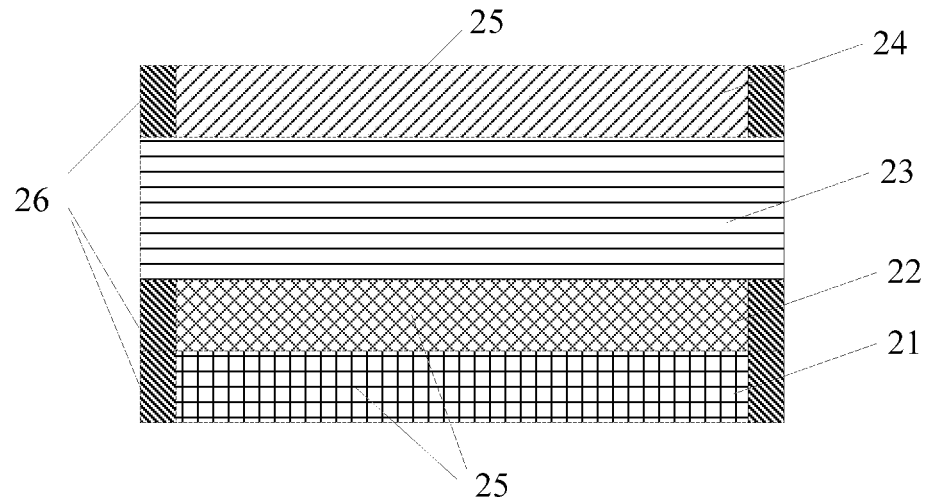
FIG. 12 is a front view of a flexible display panel according to another embodiment of the present disclosure.

In a specific embodiment, as shown in FIG. 12, the second region 26 includes an elastic material, and the second region 26 and the first region 25 are disposed in close contact with each other. The elastic material used in the second region 26 includes, but is not limited to, a rubber material or a SUS material, as long as it may effectively reduce the differences in deformations.

Figure 13:
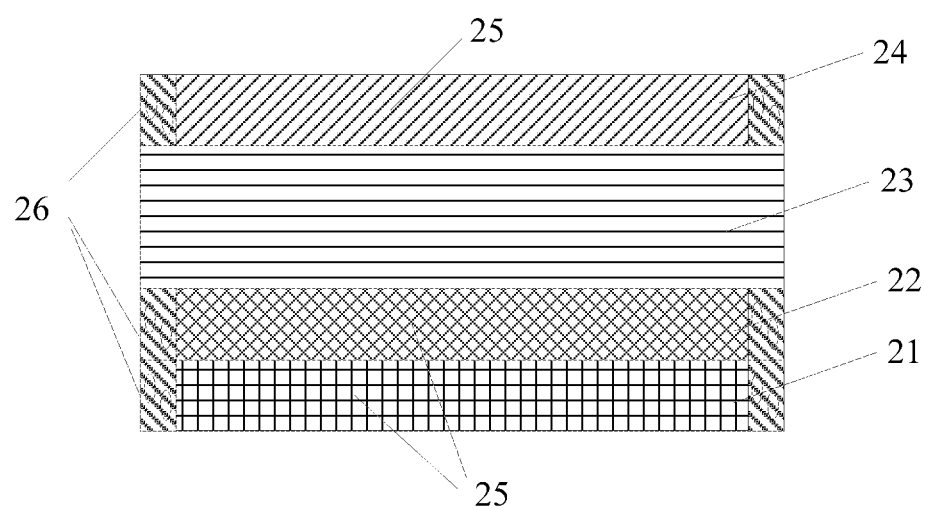
FIG. 13 is a front view of a flexible display panel according to still another embodiment of the present disclosure.

In another specific embodiment, as shown in FIG. 13, the second region 26 is formed by doping an elastic material into a side end of a material layer, and a portion of the material layer that is not doped forms the first region 25, wherein the elastic modulus of the elastic material is greater than the elastic modulus of the first region 25. The second region 26 is doped with an elastic material having a larger elastic modulus, for example, a material layer is formed first, and then a side end of the material layer is doped with particles of a rubber material, a SUS material or the like, having a larger elastic modulus, to obtain the second region 26, and the remaining portion of the material layer that is not doped with the elastic material forms the first region 25. In this way, the overall elastic modulus of the second region 26 is increased, which can effectively alleviate the differences in deformations caused by the external force, thereby improving the display effect.

Further, the second regions 26 of the flexible substrate 22, the back film 21, and the cover plate 24 may adopt different elastic materials. Respective specific elastic materials which match with the flexible substrate 22, the back film 21, and the cover plate 24 respectively may be determined by those skilled in the art according to the respective materials and the characteristic of materials, the manufacturing processes and costs of the flexible substrate, the back film and the cover plate.

In the embodiments of the present disclosure, in view of the problem of non-uniform display caused by the inconsistent deformation amounts of the conventional flexible display panels when stretched, a flexible substrate and a flexible display panel are provided. The use of an elastic material with an elastic modulus, greater than that of the display area, in the non-display area of the flexible substrate and the protective film layer can improve the display uniformity of the display panel in a stretched state, effectively improving the display effect of the display panel and improving the user experience.

Figure 14:
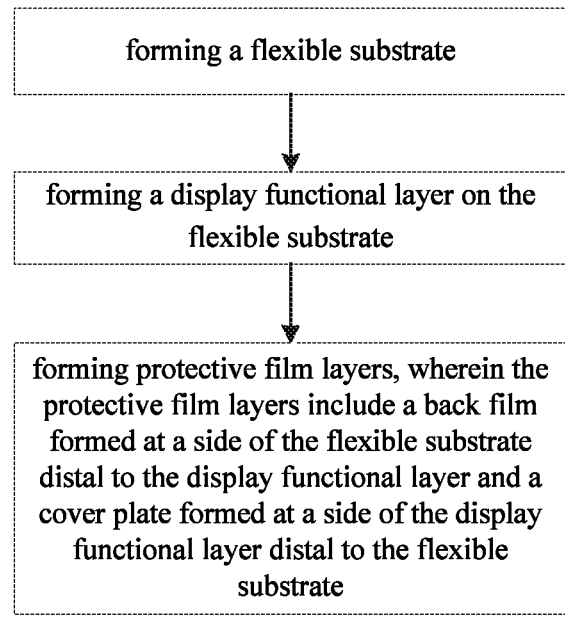
FIG. 14 is a flowchart of a method for manufacturing a flexible display panel according to an embodiment of the present disclosure.

Corresponding to the flexible display panel according to the foregoing embodiment, as shown in FIG. 14, a method for manufacturing a flexible display panel is provided in an embodiment of the present disclosure. Since the method for manufacturing a flexible display panel according to this embodiment corresponds to the flexible display panel according to the above several embodiments, the aspects in the foregoing embodiments is also applicable to the method for manufacturing a flexible display panel according to this embodiment, and therefore they will not be described in detail in this embodiment.

As shown in FIG. 14, a method for manufacturing a flexible display panel is further provided in an embodiment of the present disclosure, including: forming a flexible substrate; forming a display functional layer on the flexible substrate; and forming protective film layers, wherein the protective film layers include a back film formed at a side of the flexible substrate distal to the display functional layer and a cover plate formed at a side of the display functional layer distal to the flexible substrate. The flexible substrate and/or the protective film layers each include a first region corresponding to a display region of the display functional layer and a second region corresponding to a non-display region of the display functional layer. The elastic modulus or moduli of the first regions of the flexible substrate and/or the protective film layer are less than the elastic modulus or moduli of the second regions of the flexible substrate and/or the protective film layer.

Further, the method further includes: attaching an elastic material to a side surface of the first region to form the second region; or forming a material layer and doping an elastic material into a side end of the material layer to form the second region, a portion of the material layer which is not doped forming the first region.

Another embodiment of the present disclosure further provides a flexible display device including the flexible display panel according to the above embodiments. The flexible display device may be any product or component having a display function, such as an OLED TV, a display, a mobile phone and the like.

Figure 15:
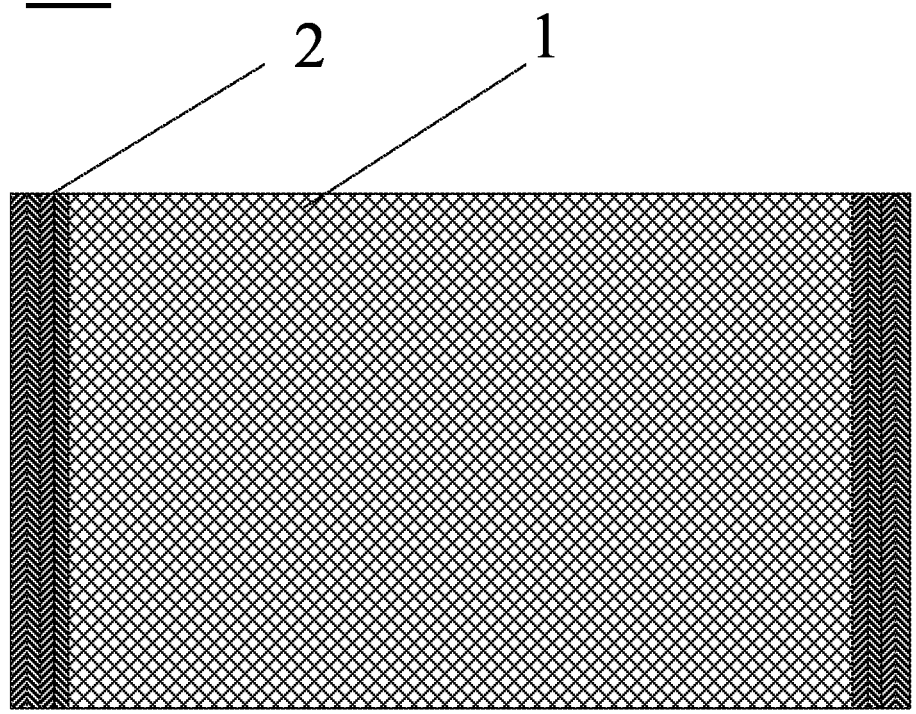
FIG. 15 is a top view of a flexible substrate according to another embodiment of the present disclosure.

As a supplement to the embodiments of the present disclosure, FIG. 15 illustrates a flexible substrate according to still another embodiment of the present disclosure. The flexible substrate in this embodiment is different from the flexible substrate in the embodiment shown in FIGS. 5 and 6 in that: the second part 2 provided at the side surface of the first part 1 includes a plurality of sections of film material, that is, the plurality of sections of film material are sequentially attached to one another and in turn to the side surface of the first part 1, elastic moduli of the sections of film material are different from the modulus of the first part 1, and the elastic moduli of the sections of film material are different from one another. Advantageously, the elastic moduli of the sections of film material gradually decrease in a direction from the outer edge to the inside of the flexible substrate. As a result, the elastic modulus can be gradually changed from the outside to the inside, and the effect of reducing the differences in the amounts of deformation of the holes can be better achieved, thereby improving the display effect.

Figure 16:
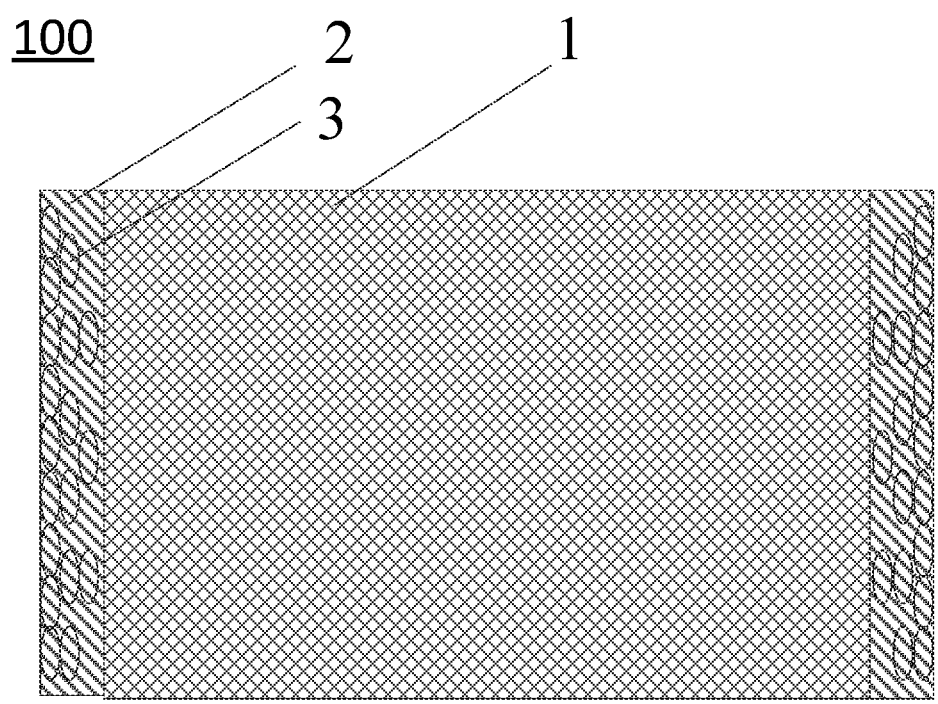
FIG. 16 is a top view of a flexible substrate according to another embodiment of the present disclosure.

Similarly, FIG. 16 illustrates a flexible substrate according to still another embodiment of the present disclosure. The flexible substrate in this embodiment is different from the flexible substrate in the embodiment shown in FIGS. 7 and 8 in that: the doping concentration of the particles 3 doped in the second part 2 gradually decreases from the outer edge to the inner side (in a direction from the second part to the first part), so that the elastic modulus of the second part gradually decreases from the outer edge to the inner part, further improving the display effect.

The solution of multiple sections of film material attaching to the first part and the solution of the doping concentration of the particles doped in the second part gradually decreasing from the outer edge to the inside are also applicable to the protective film layers, that is, the back film or the cover plate. Therefore, the second regions of the back film 21 and the cover plate 24 may include multiple sections of film material, and the elastic moduli of the sections of film material gradually decrease along the direction from the outer edge to the inside of the flexible substrate; or alternatively, the doping concentration of the particles doped in the second regions of the back film 21 and the cover plate 24 gradually decreases from the outer edge to the inner side of the flexible substrate.

In addition, the film materials in the second region of the flexible substrate 22, the back film 21, and the cover plate 24 may be the same or different; the doping concentration of the particles doped in the second regions of the flexible substrate 22, the back film 21, and the cover plate 24 may be changed in the same way or in a different way. In the embodiments of the present disclosure, in view of the problem of non-uniform display caused by the inconsistent deformation amounts of the flexible substrates of the conventional flexible display panels when stretched, a flexible substrate and a flexible display panel are provided. The use of an elastic material with an elastic modulus, greater than that of the display area, in the non-display area of the flexible substrate and the protective film layer of the flexible display panel can address the problem of display non-uniformity of the flexible display panel in a stretched state, effectively improving the display effect of the flexible display panel and improving the user experience.

Obviously, the above-mentioned embodiments of the present disclosure are merely examples for clearly describing the present disclosure, but not intended to limit the present disclosure. Other different forms of changes or modifications may be made by those skilled in the art based on the above description, but it cannot give all implementations herein. All obvious changes or modifications that come from the technical solutions of the present disclosure fall within the scope of the present disclosure.

What is claimed is:

1. A flexible substrate comprising:
   a first part; and
   a second part at a side surface of the first part which is perpendicular to a plane in which the first part extends, wherein an elastic modulus of the first part is less than an elastic modulus of the second part, and
   wherein holes are distributed in the flexible substrate.

2. The flexible substrate according to claim 1, wherein the second part comprises an elastic material, and the second part is attached to the first part.

3. The flexible substrate according to claim 2, wherein the elastic material comprises a rubber material or a stainless steel material.

4. The flexible substrate according to claim 2, wherein the second part comprises a plurality of sections of film material, and the plurality of sections of film material are sequentially attached to one another and in turn to a side surface of the first part, elastic moduli of the sections of film material are different from the modulus of the first part, and the elastic moduli of the sections of film material are different from one another.

5. The flexible substrate according to claim 1, wherein the second part is formed by doping an elastic material into a side end of a material layer, the side end is an end of the material layer close to a side surface of the material layer, which is perpendicular to a plane in which the material layer extends, and a portion of the material layer which is not doped forms the first part, wherein an elastic modulus of the elastic material is greater than the elastic modulus of the first part.

6. The flexible substrate according to claim 5, wherein a doping concentration of the elastic material doped in the second part gradually decreases in a direction from the second part to the first part.

7. The flexible substrate according to claim 1, wherein the second part comprises a plurality of sub-parts located at different side surfaces of the first part respectively.

8. The flexible substrate according to claim 7, wherein the number of the sub-parts is two, and the two sub-parts are respectively located at opposite side surfaces of the first part.

9. The flexible substrate according to claim 7, wherein the number of the sub-parts is four, and the four sub-parts surround a periphery of the first part.

10. A flexible display panel, comprising a flexible substrate, a display functional layer and at least one protective film layer, wherein:
    the flexible substrate and/or the at least one protective film layer comprises a first region corresponding to a display region of the display functional layer and a second region corresponding to a non-display region of the display functional layer,
    an elastic modulus or elastic moduli of the first region of the flexible substrate and/or the at least one protective film layer is/are less than an elastic modulus or elastic moduli of the second region of the flexible substrate and/or the at least one protective film layer, and
    holes are distributed in the flexible substrate.

11. The flexible display panel according to claim 10, wherein the second region comprises an elastic material, and the second region is attached to the first region.

12. The flexible display panel according to claim 11, wherein the at least one protective film layer comprises a back film located on a side of the flexible substrate away from the display functional layer and a cover plate located on a side of the display functional layer away from the flexible substrate.

13. The flexible display panel according to claim 12, wherein the elastic material comprises a rubber material or a stainless steel material.

14. The flexible display panel according to claim 13, wherein the flexible substrate, the back film and the cover plate each comprise a first region and a second region, and the second regions of the flexible substrate, the back film and the cover plate are made of different elastic materials.

15. The flexible display panel according to claim 10, wherein the second region is formed by doping an elastic material into a side end of a material layer, the side end is an end of the material layer close to a side surface of the material layer, which is perpendicular to a plane in which the material layer extends, and a portion of the material layer which is not doped forms the first region, wherein an elastic modulus of the elastic material is greater than the elastic modulus of the first region.

16. A flexible display device, comprising the flexible display panel according to claim 10.

17. A method for manufacturing the flexible display panel according to claim 10, comprising:
    forming a flexible substrate;
    forming a display functional layer on the flexible substrate; and
    forming at least one protective film layer,
    wherein the flexible substrate and/or the at least one protective film layer comprises a first region corresponding to a display region of the display functional layer and a second region corresponding to a non-display region of the display functional layer, wherein an elastic modulus or elastic moduli of the first regions of the flexible substrate and/or the at least one protective film layer are less than an elastic modulus or elastic moduli of the second regions of the flexible substrate and/or the at least one protective film layer, wherein holes are distributed in the flexible substrate.

18. The method according to claim 17, further comprising:
    attaching an elastic material to a side surface of the first region to form the second region; or
    forming a material layer and doping an elastic material into a side end of the material layer to form the second region, the side end being an end of the material layer close to a side surface of the material layer, which is perpendicular to a plane of in which the material layer extends, a portion of the material layer which is not doped forming the first region.

19. A method for manufacturing the flexible substrate according to claim 1, comprising:
attaching an elastic material to a side surface of a flexible substrate base, or doping an elastic material into a side end of the flexible substrate base, the side surface being perpendicular to a plane in which the flexible substrate base extends,
wherein an elastic modulus of the flexible substrate base is less than an elastic modulus of the elastic material.

* * * * *